(12) United States Patent
Mueller et al.

(10) Patent No.: US 7,250,715 B2
(45) Date of Patent: Jul. 31, 2007

(54) WAVELENGTH CONVERTED SEMICONDUCTOR LIGHT EMITTING DEVICES

(75) Inventors: Gerd O. Mueller, San Jose, CA (US); Regina B. Mueller-Mach, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 139 days.

(21) Appl. No.: 10/785,616

(22) Filed: Feb. 23, 2004

(65) Prior Publication Data

US 2005/0184638 A1    Aug. 25, 2005

(51) Int. Cl.
*H01J 63/04*    (2006.01)

(52) U.S. Cl. .................. 313/485; 313/486; 313/487; 313/512

(58) Field of Classification Search ............ 313/503, 313/485–487, 512; 257/89, 98, 100; 362/800, 362/293; 445/50, 57
See application file for complete search history.

(56) References Cited

U.S. PATENT DOCUMENTS

| | | | |
|---|---|---|---|
| 5,998,925 A * | 12/1999 | Shimizu et al. ............ 313/503 |
| 6,351,069 B1 * | 2/2002 | Lowery et al. ............ 313/512 |
| 6,501,091 B1 * | 12/2002 | Bawendi et al. ............ 257/14 |
| 6,501,100 B1 | 12/2002 | Srivastava et al. | |
| 6,565,233 B1 * | 5/2003 | Richardson ............ 362/293 |
| 6,576,488 B2 * | 6/2003 | Collins et al. ............ 438/29 |
| 6,576,930 B2 | 6/2003 | Reeh et al. | |
| 6,650,044 B1 * | 11/2003 | Lowery ............ 313/502 |
| 6,696,703 B2 * | 2/2004 | Mueller-Mach et al. ...... 257/98 |
| 6,797,412 B1 * | 9/2004 | Jain et al. ............ 428/690 |
| 6,888,173 B2 * | 5/2005 | Ishii et al. ............ 257/100 |
| 6,994,453 B2 * | 2/2006 | Blanchard ............ 362/293 |
| 2002/0030194 A1 * | 3/2002 | Camras et al. ............ 257/98 |
| 2002/0140891 A1 * | 10/2002 | Tomioka et al. ............ 349/141 |
| 2002/0145685 A1 | 10/2002 | Mueller-Mach et al. | |
| 2004/0007961 A1 | 1/2004 | Srivastava et al. | |
| 2005/0057145 A1 * | 3/2005 | Shieh et al. ............ 313/503 |

* cited by examiner

*Primary Examiner*—Edward J. Glick
*Assistant Examiner*—Irakli Kiknadze
(74) *Attorney, Agent, or Firm*—Patent Law Group LLP

(57) ABSTRACT

In a wavelength converted semiconductor light emitting device with at least two wavelength converting materials, the wavelength converting materials in the device are arranged relative to the light emitting device and relative to each other to tailor interaction between the different wavelength converting materials in order to maximize one or more of the luminous equivalent, color rendering index, and color gamut of the combined visible light emitted by the device.

33 Claims, 11 Drawing Sheets

455+YAG:Ce+SrS:Eu

WAVELENGTH CONVERTED SEMICONDUCTOR LIGHT EMITTING DEVICES

BACKGROUND

1. Field of Invention

This invention relates to wavelength-converted semiconductor light-emitting devices.

2. Description of Related Art

Semiconductor light-emitting devices including light emitting diodes (LEDs) are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region. III-nitride light emitting devices efficiently emit UV through green light.

Illumination systems have been proposed which convert the color of light emitted by light emitting diodes by means of a fluorescent material such as a phosphor.

A dichromatic illumination system, which mixes the primary emission of a blue LED with light emitted by a yellow phosphor is described in U.S. Pat. No. 5,998,925. A $Y_3Al_5O_{12}:Ce^{3+}$ phosphor is coated on a III-nitride LED, and a portion of the blue light emitted from the LED is converted to yellow light by the phosphor. Another portion of the blue light from the LED is transmitted through the phosphor. Thus, this system emits both blue light emitted from the LED, and yellow light emitted from the phosphor. The mixture of blue and yellow emission bands are perceived as white light by an observer with a CRI between about 75 and about 80 and a color temperature, $T_c$, that ranges from about 6000 K to about 8000 K.

However, white light LEDs based on the dichromatic approach can only be used to a limited extent for general-purpose illumination, on account of poor color rendering caused by the absence of red color components.

A red-deficiency-compensating illumination system is illustrated in FIG. 1 and described in more detail in U.S. Pat. No. 6,351,069. LED 34 of FIG. 1 is designed to produce white output light that is well-balanced with respect to color to provide illumination for good color rendition. "The LED 34 includes the Gallium Nitride (GaN) die 12 that is positioned on the reflector cup lead frame 14 and is electrically coupled to the leads 16 and 18. The leads 16 and 18 provide excitation power to the GaN die 12. The GaN die 12 may generally be in a shape of a square. In the preferred embodiment, the GaN die 12 is configured to emit primary light having a peak wavelength of 470 nm, which lies within the blue region of the light spectrum, i.e., blue light. The GaN die 12 is covered by a spacing layer 36 made of a transparent material. The transparent material may be clear epoxy or glass.

"Adjacent to the spacing layer 36 is a fluorescent layer 38. The fluorescent layer 38 includes the fluorescent material 22 and a second fluorescent material 40. The fluorescent material 22 has a property to absorb the primary light and emit secondary light having a first peak wavelength, while the fluorescent material 40 has a property to absorb the primary light and emit secondary light having a second peak wavelength. Preferably, the secondary light emitted by the fluorescent material 22 has a broadband spectral distribution centered in the yellow region of the visible spectrum. However, the secondary light emitted by the fluorescent material 40 has a . . . spectral distribution that is intense in the red region of the visible spectrum. Thus, when the primary light and the secondary lights emitted by the fluorescent materials 22 and 40 are combined, white light is created that is rich in red color, in addition to other colors. The peak wavelengths of the secondary lights depend on the composition of the fluorescent materials 22 and 40, in addition to the peak wavelength of the primary light.

Layer 38 including the two fluorescent materials is a phosphor-resin mixture that "includes two fluorescent materials that are combined with a resin paste." The phosphor-resin mixture "is deposited over the encapsulation layer to form a fluorescent layer that uniformly covers the encapsulation layer. The deposited phosphor-resin mixture may then be gelled, i.e., partially cured." Thus, in the red-deficiency compensating system of U.S. Pat. No. 6,351,069, two fluorescent materials are mixed together, then suspended in a resin layer.

SUMMARY

In accordance with embodiments of the invention, a wavelength converted semiconductor light emitting device includes a first wavelength converting material and a second wavelength converting material. The first wavelength converting material emits light having a shorter wavelength than light emitted by the second wavelength converting material. In some embodiments, the first and second wavelength converting materials are arranged to maximize one or more of the luminous equivalent, the color rendering index, or the gamut of the combined visible light emitted by the device. In some embodiments, the first and second wavelength converting materials are deposited on the light emitting device adjacent to each other. In some embodiments, the first and second wavelength converting materials are deposited as discrete layers.

DETAILED DESCRIPTION

In accordance with embodiments of the invention, systems including multiple wavelength converting materials such as phosphors combined with semiconductor light emitting devices are disclosed. In the below description, "mixed" or "composite" light refers to the combination of light emitted by the semiconductor light emitting device and light emitted by all the phosphors in the system.

In some embodiments, a blue light emitting diode is combined with a yellow- or green-emitting phosphor and a red-emitting phosphor. Examples of suitable yellow- or green-emitting phosphors include $(Lu_{1-x-y-a-b}Y_xGd_y)_3(Al_{1-z}Ga_z)_5O_{12}$:$Ce_a^{3+}Pr_b^{3+}$ wherein $0<x<1$, $0<y<1$, $0<z\leq0.1$, $0<a\leq0.2$ and $0<b\leq0.1$ including, for example, $Lu_3Al_5O_{12}$:$Ce^{3+}$ and $Y_3Al_5O_{12}$:$Ce^{3+}$; $(Sr_{1-a-b}Ca_bBa_c)Si_xN_yO_z$:$Eu_a^{2+}$ ($a=0.002$-$0.2$, $b=0.0$-$0.25$, $c=0.0$-$0.25$, $x=1.5$-$2.5$, $y=1.5$-$2.5$, $z=1.5$-$2.5$) including, for example, $SrSi_2N_2O_2$:$Eu^{2+}$; $(Sr_{1-u-v-x}Mg_uCa_vBa_x)(Ga_{2-y-z}Al_yIn_z S_4)$:$Eu^{2+}$ including, for example, $SrGa_2S_4$:$Eu^{2+}$; and $Sr_{1-x}Ba_xSiO_4$:$Eu^{2+}$. Examples of suitable red-emitting phosphors include $(Ca_{1-x}Sr_x)S$:$Eu^{2+}$ wherein $0<x\leq1$ including, for example, CaS:$Eu^{2+}$ and SrS:$Eu^{2+}$; and $(Sr_{1-x-y}Ba_xCa_y)_{2-z}Si_{5-a}Al_aN_{8-a}O_a$:$Eu_z^{2+}$ wherein $0\leq A<5$, $0<x\leq1$, $0\leq y\leq1$, and $0<z\leq1$ including, for example, $Sr_2Si_5N_8$:$Eu^{2+}$.

In some embodiments, a UV light emitting diode is combined with a blue-emitting phosphor, a yellow- or green-emitting phosphor and a red-emitting phosphor. Examples of suitable yellow- or green-emitting phosphors and suitable red-emitting phosphors are listed above. Examples of suitable blue-emitting phosphors include, for example, $MgSrSiO_4$.

Though the embodiments described below refer to a blue LED combined with two phosphors and a UV LED combined with three phosphors, it is to be understood that more or fewer phosphors and LEDs emitting other colors may be used.

Figure 2:
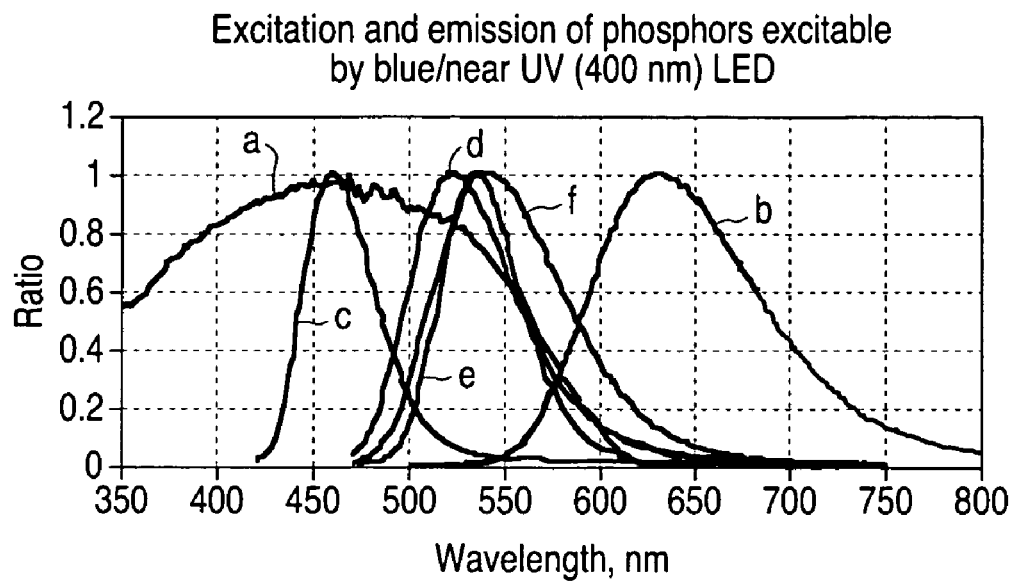
FIG. 2 illustrates the excitation spectrum of $Sr_2Si_5N_8:Eu^{2+}$ and the emission spectra of several phosphors.

The excitation and emission spectra of some of the above-listed phosphors are illustrated in FIG. 2. In FIG. 2, spectrum a is the excitation spectrum of $Sr_2Si_5N_8$:$Eu^{2+}$; spectrum b is the emission spectrum of $Sr_2Si_5N_8$:$Eu^{2+}$, spectrum c is the emission spectrum of $MgSrSiO_4$; spectrum d is the emission spectrum of $Sr_{1-x}Ba_xSiO_4$:$Eu^{2+}$; spectrum e is the emission spectrum of $SrGa_2S_4$:$Eu^{2+}$; and spectrum f is the emission spectrum of $SrSi_2N_2O_2$:$Eu^{2+}$.

The inventors have observed that when some phosphors are mixed together, interaction between the mixed phosphors may adversely affect the efficiency and spectrum of the device. Accordingly, depending on the phosphors in the combination, depositing the phosphors as separate, discrete layers, as described below in FIGS. 3-6, may improve the performance of the device. Whether the preferred phosphor arrangement is a mix of phosphors as in FIG. 1 or discrete layers as in FIGS. 3-6 may depend on the excitation and emission spectra of the phosphors and on the application. Three applications are described below: an illumination device with the phosphors deposited directly on an LED, a display with the phosphors spaced apart from the LEDs, and an illumination device with the phosphors spaced apart from the LEDs. For an illumination device, the phosphor arrangement may be chosen to maximize the color rendering index, given as CRI or Ra. For a display device, the phosphor arrangement may be chosen to maximize color gamut for the filters used in the device. In either an illumination device or a display device, it is desirable to maximize the luminous equivalent. The luminous equivalent is the highest efficiency possible for a given spectrum and is expressed in lumens/W.

Figure 1:
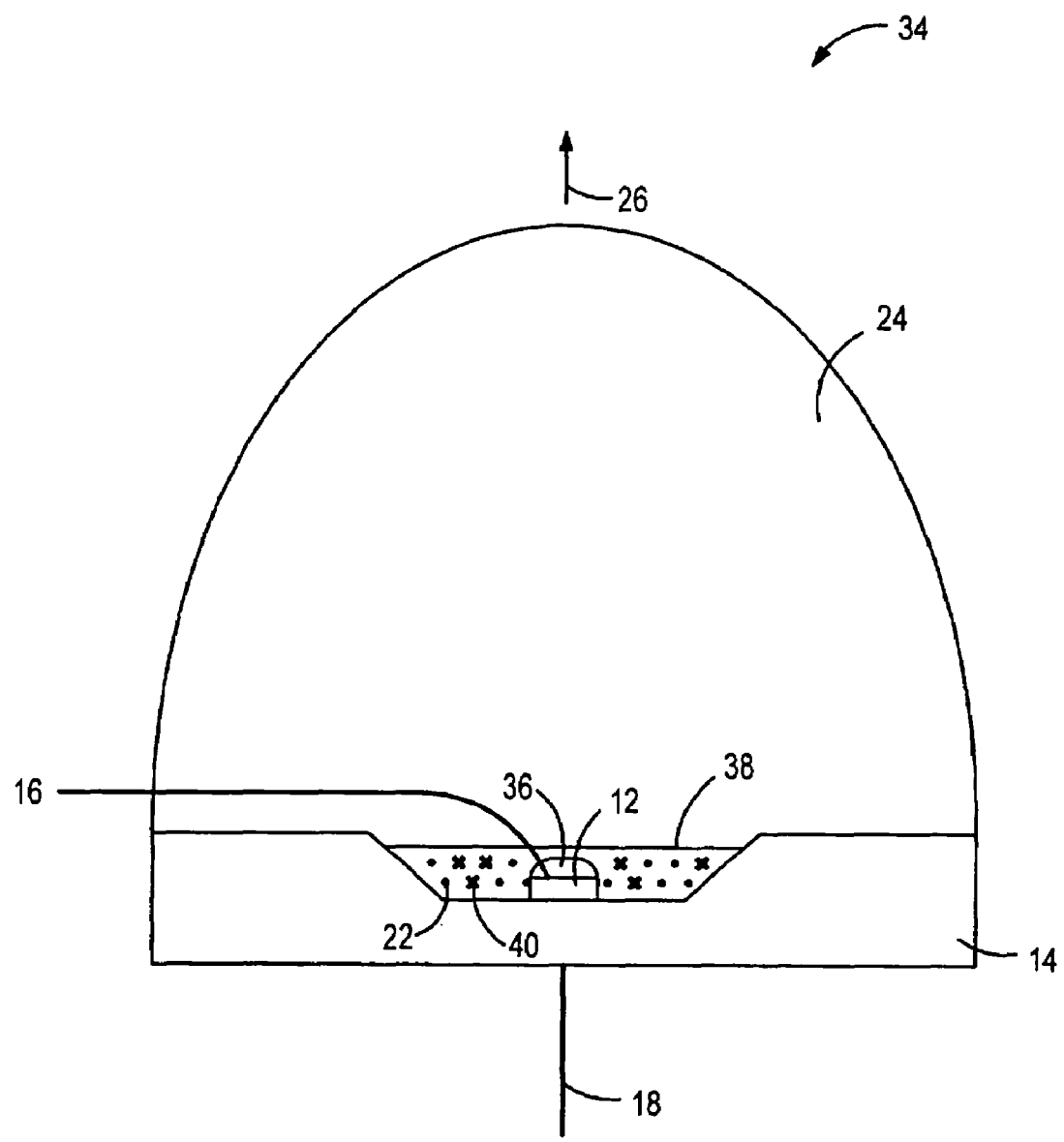
FIG. 1 illustrates a prior art red-deficiency-compensating illumination system.

FIGS. 1 and 3-6 illustrate a first application, illumination devices with phosphors deposited directly on an LED, either as a mix in FIG. 1 or as discrete layers in FIGS. 3-6. In an illumination device, the phosphor arrangement is selected to maximize luminous equivalent and color rendering index. Determination of which of the different phosphor arrangements of FIGS. 1 and 3-6 are appropriate for a particular combination of phosphors is described in the context of two examples, a device with $Y_3Al_5O_{12}$:$Ce^{3+}$ and $Sr_2Si_5N_8$:$Eu^{2+}$ phosphors and a device with $Y_3Al_5O_{12}$:$Ce^{3+}$ and CaS:$Eu^{2+}$ phosphors.

In a first example, a blue light emitting diode is combined with $Y_3Al_5O_{12}$:$Ce^{3+}$ and $Sr_2Si_5N_8$:$Eu^{2+}$ phosphors. FIG. 2 illustrates the excitation and emission spectra of $Y_3Al_5O_{12}$:$Ce^{3+}$ and $Sr_2Si_5N_8$:$Eu^{2+}$. In a first approximation of the combined light emitted BY the system, the spectra of the blue light emitting diode and the two phosphors are added. The emission spectra of $Y_3Al_5O_{12}$:$Ce^{3+}$ and $Sr_2Si_5N_8$:$Eu^{2+}$ illustrate that both phosphors have strong emission at orange wavelengths, for example at approximately 600 nm. The overlap of the emission spectra at orange wavelengths shifts the appearance of the mixed light away from red toward shorter wavelengths. This shift may negatively impact the color rendering of the mixed light.

In addition, FIG. 2 illustrates that the emission spectrum of $Y_3Al_5O_{12}$:$Ce^{3+}$ overlaps with the excitation spectrum of $Sr_2Si_5N_8$:$Eu^{2+}$. As a result, a portion of the emission from the $Y_3Al_5O_{12}$:$Ce^{3+}$ phosphor may be consumed by the $Sr_2Si_5N_8$:$Eu^{2+}$ phosphor, reducing the amount of green/yellow light in the mixed light. In addition, absorption by $Sr_2Si_5N_8$:$Eu^{2+}$ of light emitted by $Y_3Al_5O_{12}$:$Ce^{3+}$ exacerbates the shift of the mixed light toward shorter, orange wavelengths. Both effects may negatively impact the color rendering of the mixed light.

Absorption by the red-emitting phosphor of light emitted by the green/yellow emitting phosphor may be reduced by separating the green/yellow and red phosphors into discrete regions. FIGS. 3-6 illustrate embodiments of the device where the red-emitting phosphor and green/yellow-emitting phosphor are deposited such that absorption by the red-emitting phosphor of light emitted by the green/yellow-emitting phosphor is reduced.

Figure 3:
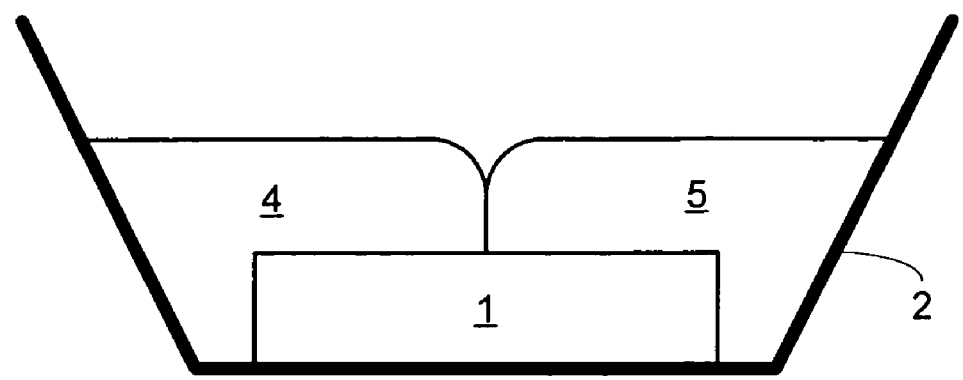
FIGS. 3, 4, 5, and 6 illustrate embodiments of the invention employing discrete phosphor layers to minimize phosphor interaction.

In the device illustrated in FIG. 3, a semiconductor light emitting device 1 is disposed in a reflector cup 2. The green/yellow phosphor 5 is mixed with a resin, silicone, or other transparent material and disposed on one side of a reflector cup 2, while any other phosphors 4, including a red-emitting phosphor, are mixed separately with a resin, silicone, or other transparent material and disposed on the other side of reflector cup 2, such that slurry 5 does not appreciably mix with slurry 4. In some embodiments, the viscosity of the transparent material forming the slurry is selected to avoid mixing phosphor 4 with phosphor 5. Since green/yellow-emitting phosphor 5 and any other phosphors 4 are adjacent to each other, rather than mixed in the same slurry, light emitted by green/yellow phosphor 5 is less likely to be absorbed by any red-emitting phosphors in slurry 4.

Figure 4:
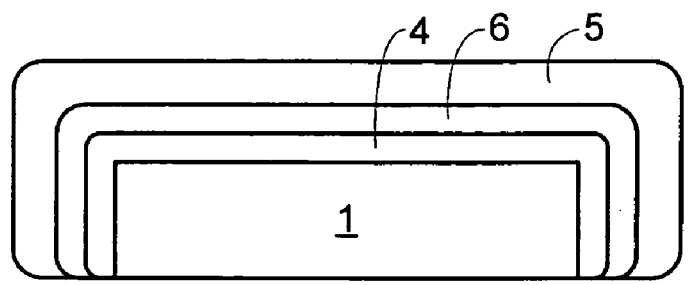

In the device illustrated in FIG. 4, the green/yellow-emitting phosphor 5 and other phosphors 4 are deposited over LED 1 as discrete layers. Phosphor layer 4, including any red-emitting phosphors, is deposited closest to LED 1. Green/yellow-emitting phosphor 5 is then deposited over phosphor layer 4. Phosphor layers 4 and 5 may be separated by an optional transparent layer 6. Phosphor layers 4 and 5 may be deposited as slurries in a resin or other transparent material; deposited as thin films by, for example, electron beam evaporation, thermal evaporation, rf-sputtering, chemical vapor deposition, or atomic layer epitaxy; or deposited as conformal layers over LED 1 by, for example, screen printing, stenciling as described in U.S. Pat. No. 6,650,044, or by electrophoretic deposition as described in U.S. Pat. No. 6,576,488. Thin films are described in more detail in U.S. Pat. No. 6,696,703. Each of U.S. Pat. No. 6,696,703, U.S. Pat. No. 6,650,044 and U.S. Pat. No. 6,576,488 are incorporated herein by reference. In contrast to a thin film, which typically behaves as a single, large phosphor particle, the phosphor in a conformal layer generally behaves as multiple phosphor particles. In addition a thin film typically contains no materials other than phosphor. A conformal layer often includes materials other than phosphor, such as, for example, silica.

In some embodiments, one or more dichroic filters are included in the device. A dichroic filter designed to transmit light emitted by LED 1 but to reflect light emitted by phosphors 4 and 5 may be included between LED 1 and phosphor layer 4. Layer 6 between green/yellow-emitting phosphor 5 and red-emitting phosphor 4 may be a dichroic filter designed to transmit light emitted by red-emitting phosphor 4 and LED 1, and reflect light emitted by green/yellow-emitting phosphor 5. Dichroic filters may reduce the amount of radiation back-scattered by phosphor layers 4 and 5 into LED 1, where it can be absorbed.

Figure 5:
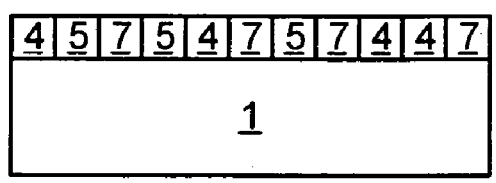

In the device illustrated in FIG. 5, the green/yellow-emitting phosphor 5 and other phosphors 4 are deposited on LED 1 in a plurality of small regions. The different regions may form a pattern, such as a checkerboard pattern. If light from LED 1 is to escape unconverted, as in the case where blue light emitted by the LED mixes with green and red light emitted by phosphors to make white light, the amount of unconverted light may be controlled by controlling the thickness of phosphor regions 4 and 5, or by leaving regions of LED 1 uncovered, or covered by an optional transparent material 7 that does not convert the light emitted by LED 1. Patterns of different phosphor layers as illustrated in FIG. 5 may be formed by depositing a first layer of phosphor by electrophoretic deposition, patterning that layer using conventional lithography and etching techniques, then depositing a second phosphor layer by electrophoretic deposition. Alternatively, patterns of phosphor layers may be deposited by screen printing or ink jet printing. In some embodiments, a pattern of phosphor layers may be formed by pipetting the individual phosphor mixes 4 and 5 into wells in a clear plastic microplate used for microbiology. The phosphor-filled microplate is then placed on LED 1. Phosphor-filled microplates may be formed separately from LED 1.

Figure 6:
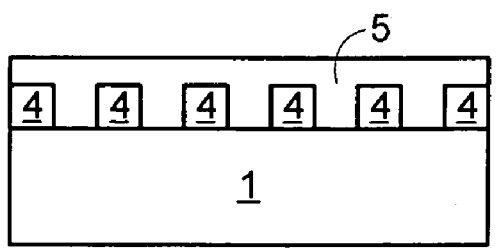

In the device illustrated in FIG. 6, a plurality of small regions of phosphor 4, which includes any red-emitting phosphors, is formed on the surface of LED 1. A layer of green/yellow-emitting phosphor 5 is deposited over the plurality of regions of phosphor 4.

Each of the embodiments illustrated in FIGS. 3-6 may reduce the above-described absorption problem. In each case, light emitted by LED 1 is incident on the red-emitting phosphor first, or is incident on the red-emitting phosphor and the green/yellow-emitting phosphor in separate regions. The arrangements illustrated in FIGS. 3-6 thus reduce the probability that light emitted from the green/yellow-emitting phosphor will be absorbed by a red-emitting phosphor.

Figure 15:
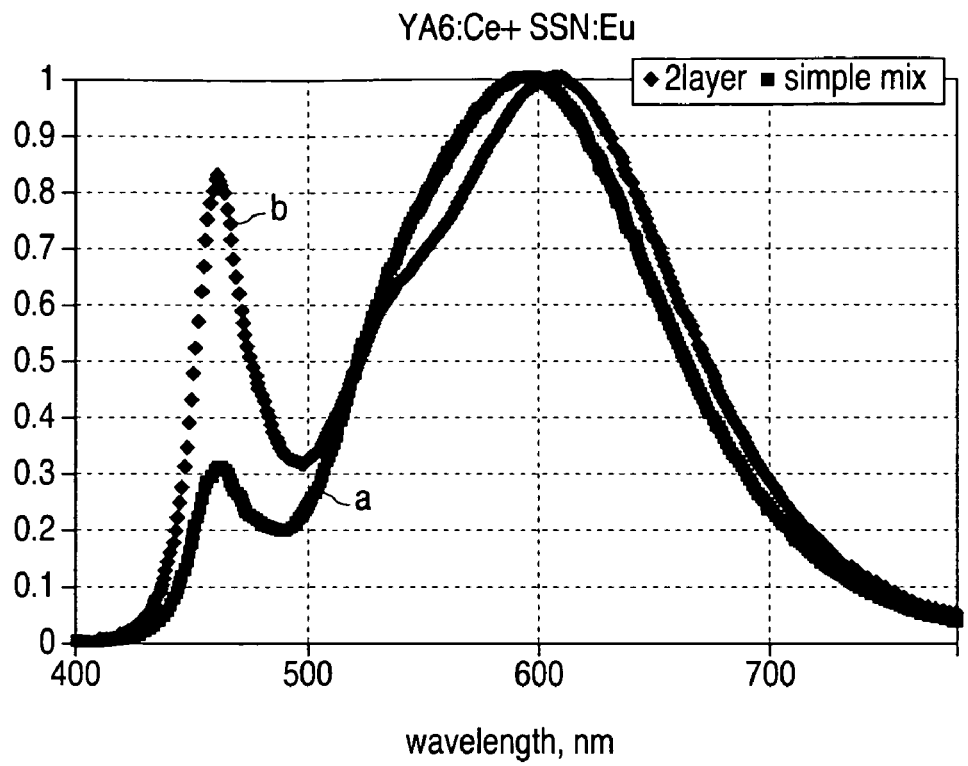
FIG. 15 illustrates two experimental spectra of a system including a blue light emitting diode and $Y_3Al_5O_{12}$:$Ce^{3+}$ and $Sr_2Si_5N_8$:$Eu^{2+}$ phosphors.

Separating the phosphors as illustrated in FIGS. 3-6 significantly improves the color rendering of an illumination system including a blue LED, $Y_3Al_5O_{12}:Ce^{3+}$, and $Sr_2Si_5N_8:Eu^{2+}$ phosphors. FIG. 15 illustrates spectra of mixed light from a blue LED, $Y_3Al_5O_{12}:Ce^{3+}$, and $Sr_2Si_5N_8:Eu^{2+}$ phosphors in a mixed phosphor arrangement as illustrated in FIG. 1 (curve a), and in a layered phosphor arrangement as illustrated in FIG. 4 (curve b). Both phosphor arrangements have a high luminous equivalent, 296 for the layered arrangement and 343 for the mixed arrangement, but the layered arrangement shows a significantly higher color rendering index: 87, compared to 75 for the mixed arrangement.

Figure 14:
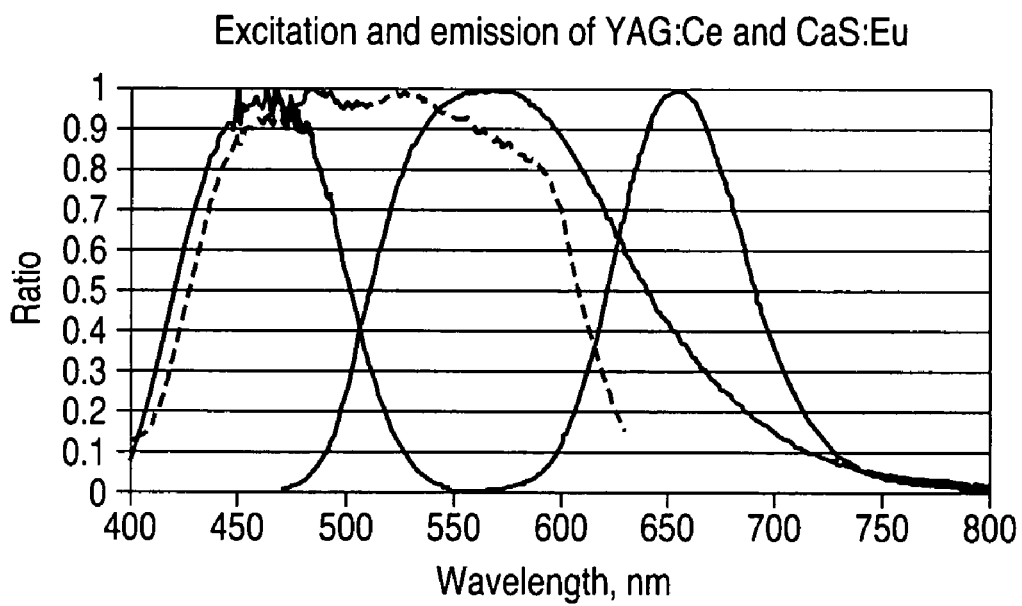
FIG. 14 illustrates the excitation and emission spectra of $Y_3Al_5O_{12}$:$Ce^{3+}$ and CaS:$Eu^{2+}$ phosphors.
Figure 7:
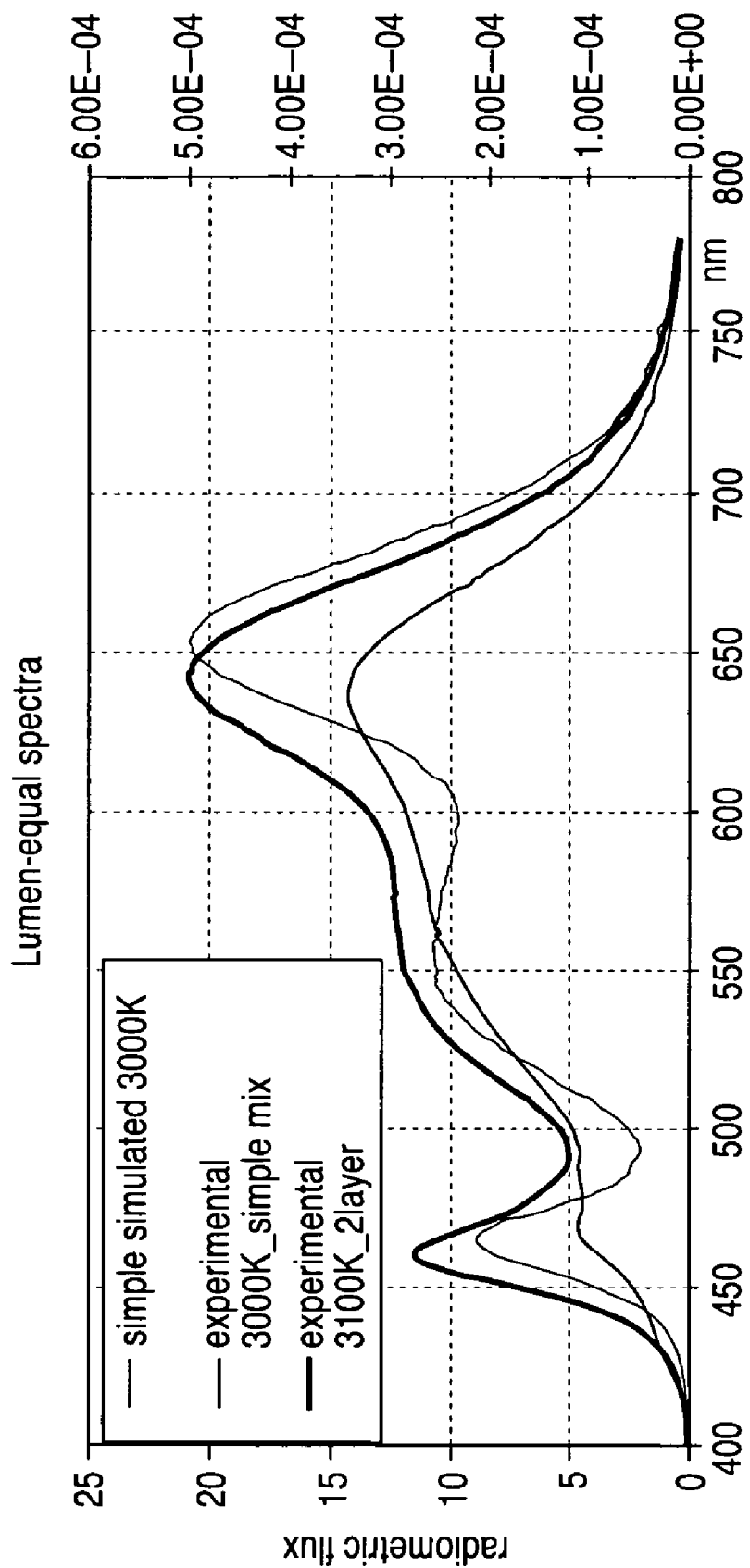
FIG. 7 illustrates a simulated spectrum and two experimental spectra of a system including a blue light emitting diode and $Y_3Al_5O_{12}:Ce^{3+}$ and $CaS:Eu^{2+}$ phosphors.

In some embodiments, separating the green/yellow- and red-emitting phosphors does not improve the performance of the device, as illustrated in a second example of an illumination system, where a blue LED is combined with $Y_3Al_5O_{12}:Ce^{3+}$ and $CaS:Eu^{2+}$ phosphors. FIG. 14 illustrates the excitation and emission spectra of $Y_3Al_5O_{12}:Ce^{3+}$ and $CaS:Eu^{2+}$. The left most solid curve is the excitation spectrum of $Y_3Al_5O_{12}:Ce^{3+}$. The center solid curve is the emission spectrum of $Y_3Al_5O_{12}:Ce^{3+}$. The dashed curve is the excitation spectrum of $CaS:Eu^{2+}$. The right most solid curve is the emission spectrum of $CaS:Eu^{2+}$. FIG. 7 illustrates three spectra of composite light from a system including a blue LED and $Y_3Al_5O_{12}:Ce^{3+}$ and $CaS:Eu^{2+}$ phosphors. Curve a is a simulated spectrum calculated by the superposition of the emission spectrum of the light emitting diode and the two phosphors. Curve b is an observed spectrum from a device formed by mixing the two phosphors in a single layer, as illustrated in FIG. 1. Curve c is an observed spectrum from a device including two discrete phosphor layers, as illustrated in FIG. 4. Layering the phosphors decreases the luminous equivalent of the device. The layered device has a color rendering index of 96 and a luminous equivalent of 265. The mixed device has a Ra of 91 and a luminous equivalent of 300. Accordingly, layering the phosphors reduces the luminous equivalent of the device, without significantly improving the color rendering. As such, mixing the phosphors is preferred.

Many factors may influence whether multiple phosphors are best mixed or formed as discrete layers. The difference between the refractive indices of the two phosphors and the particle size of the two phosphors influences the likelihood of absorption by the red phosphor of emission from the green/yellow phosphor. As the step in index of refraction between two materials increases, the likelihood that light incident on the interface between the two materials will be reflected rather than absorbed also increases. Thus, if the refractive indices of the two phosphors are quite different, light emitted by the green/yellow phosphor is likely to be scattered, rather than absorbed, when incident on the red phosphor. In addition, the location of the red-emitting phosphor emission spectrum may influence whether two phosphors should be mixed. As described above, interaction between a green/yellow-emitting phosphor and a red-emitting phosphor may shift the red component of the composite light from the system toward shorter, more orange wavelengths, resulting in reduced color rendering. The longer the peak wavelength of the red-emitting phosphor, the more the system can tolerate shifting of the red toward shorter wavelengths without impacting color rendering. Also, the overlap between the emission spectrum of the green/yellow emitting phosphor and the excitation spectrum of the red-emitting phosphor may influence whether two phosphors should be mixed. The more significant the overlap, the more likely a significant amount of emission from the green/yellow-emitting phosphor will be absorbed by the red-emitting phosphor. Accordingly, the more significant the overlap, the more likely the performance of the system will be changed by separating the phosphors.

In some embodiments, though the phosphors are separated into discrete layers, a small amount of, for example, a red-emitting phosphor may be included in a green/yellow emitting phosphor layer. The presence of a small amount of red-emitting phosphor in the green/yellow emitting phosphor layer may improve the color rendering of the composite light.

Figure 8:
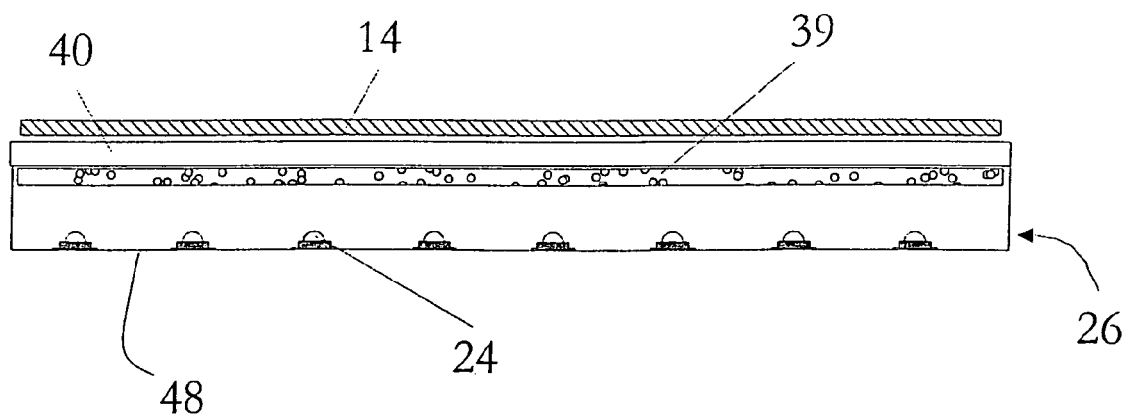
FIG. 8 illustrates a display according to embodiments of the present invention.

FIG. 8 illustrates a second application, a display device with phosphors spaced apart from one or more LEDs. The device illustrated in FIG. 8 is described in more detail in application Ser. No. 10/678,541, filed Oct. 3, 2003, titled "LCD Backlight Using Two-Dimensional Array LEDs," and incorporated herein by reference.

FIG. 8 is a side view of an LCD display. An array of LEDs 24 is placed on the rear panel of the backlight 26. The backlight 26 is covered with a diffusing cover plate 40. The diffuser 40 is for example made of acrylic or glass, with a roughened surface for diffusing light. Alternatively, the diffuser 40 may have light scattering particles with the acrylic or glass sheet. Many types of diffusers are known and may be used with the backlight 26. A transparent plate may be used instead of the diffuser 40 if the light output of the backlight 26 is sufficiently diffuse without a diffuser. Additional films (not shown) for increasing the brightness or efficiency might be used on top of the diffuser, just before the LCD, as for example Brightness Enhancement Film and Dual Brightness Enhancement Film, as for example produced by 3M.

The back plane and the sidewalls of the backlight 26 are covered with highly reflective materials. Good results have been obtained with a white diffuse reflective film on the back (e.g., E60L, produced by Toray, Japan), and a specular reflecting material on the sidewalls (e.g., Miro material, as produced by Alanod, Germany), but other configurations work as well. The materials used should have a high coefficient of reflection, preferably >90%. By using these high reflective materials, a high recycling efficiency is achieved. This is in particular important when Brightness Enhancement Films are used, as mentioned above, as these films reflect the light which can not be used in the first pass, and which needs to be recycled in order to contribute to the output of the LCD during a second or third pass.

LCD panel 14 is placed in front of the backlight 26. The LCD panel 14 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 14 and the backlight 26, additional films can be used, such as a brightness enhancement film (BEF) or polarization recovery film (DBEF).

LEDs 26 are generally blue or UV-emitting LEDS. A phosphor layer 39, which may include multiple phosphors mixed as in FIG. 1, or layered as in FIGS. 3-6, is formed on the cover plate 40, rather than directly on LEDs 26. In some embodiments, different phosphor layers are formed on different surfaces of cover plate 40. The cover plate 40 may or may not be a diffuser, depending on the amount of diffusing performed by the phosphor. Spacing phosphor layer 39 apart from LEDs 26 is attractive because light emitted from the phosphor to the rear of the backlight 26 has a larger recycling efficiency than into the LED chips, due to the high reflectivity of the films used in the backlight 26. In addition to the recycling efficiency, the phosphors are not required to withstand the high temperatures near the LEDs and are not required to be chemically compatible with the LEDs, increasing he number of possible suitable phosphors and potentially improving the efficiency and lifetime of the device. From a logistics point of view, this solution is attractive as well, as the blue backlight can be used for a large range of different displays, with different types of color filters, and only the phosphor layer thickness and phosphor concentration has to be optimized to fit a particular LCD.

In the display device illustrated in FIG. 8, the phosphor arrangement is selected to maximize luminous equivalent and the color gamut.

FIGS. 9, 10, 11, 12, and 13 illustrate the performance of several phosphor compositions combined with blue light emitting diodes. In each of FIGS. 9-13, curve a represents the Planckian locus, which is considered true white light, and curve b represents the CIE chart. Curve c illustrates the gamut of colors possible with the filters in RGB pixel filter of the device of FIG. 8. Point d represents the color of mixed light emitted by the LED and phosphors. Curve e represents the gamut of colors demanded by the NTSC standard. Point f represents the color of light after being filtered by each of the red, blue, and green filters. Points g illustrate the spectrum of composite light before filtering. Curves h, i, and j illustrate the performance of the blue, green, and red filters of the RGB pixel filter of FIG. 8. Curve k illustrates the composite light emitted by the combination of the LEDs and phosphors. Curve l illustrates the composite light after passing through the blue filter represented in curve h. Curve m illustrates the composite light after passing through the green filter represented in curve i. Curve n illustrates the composite light after passing through the red filter represented in curve j.

Figure 9:
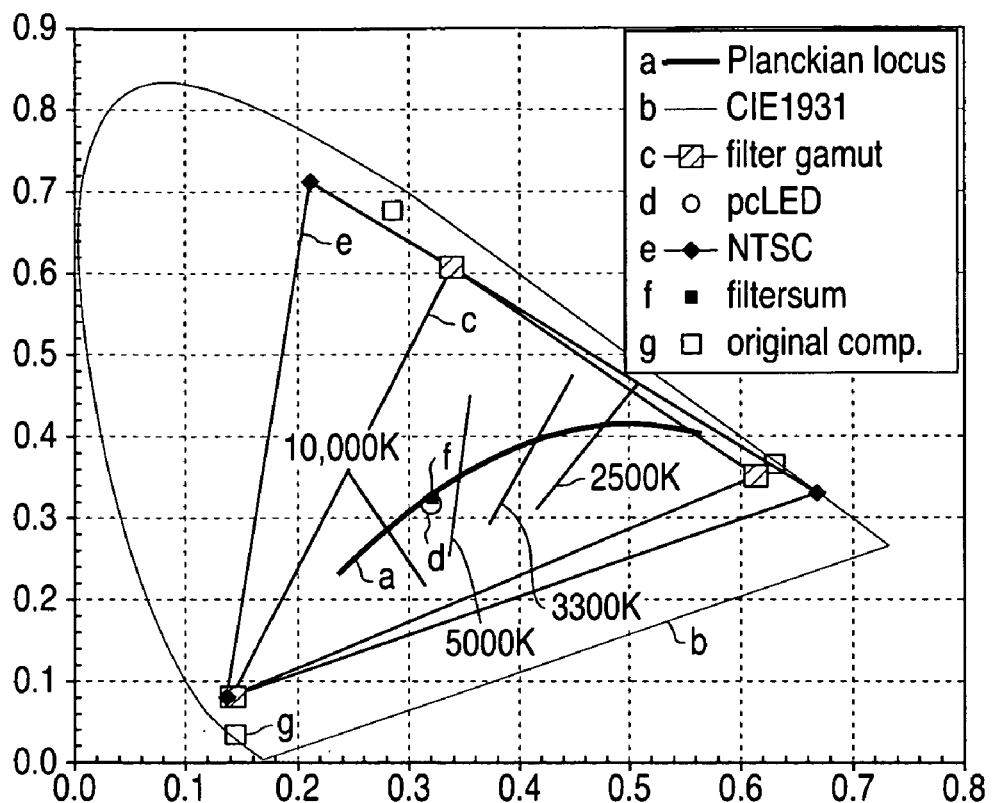
FIGS. 9, 10, 11, 12, and 13 illustrate five examples of LED and phosphor combinations implemented in the device of FIG. 8.
Figure 9:
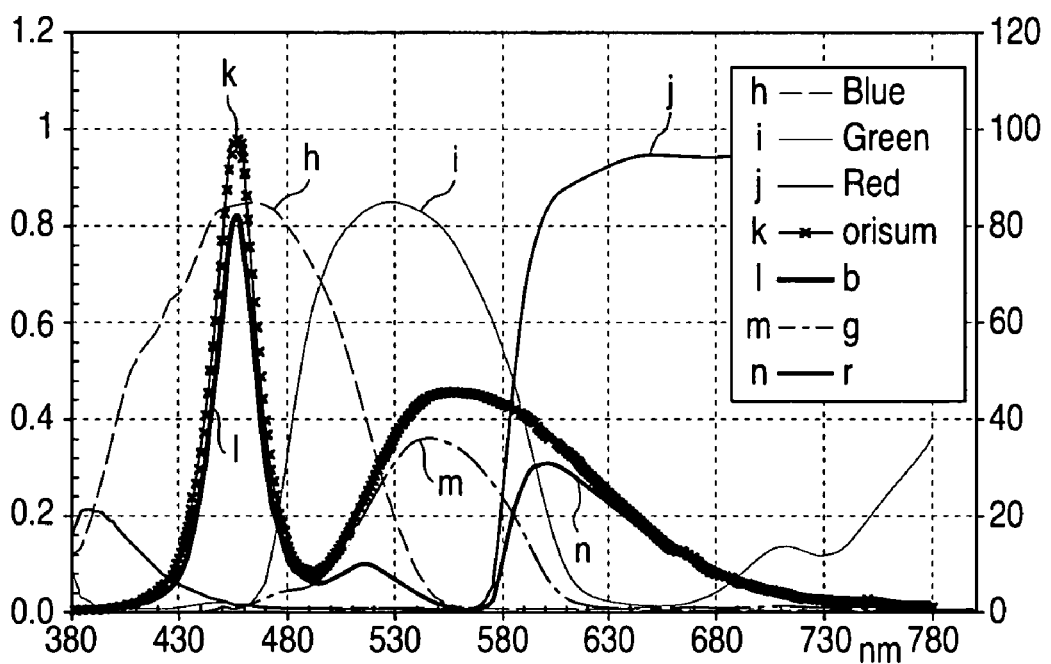

In the device illustrated in FIG. 9, a blue LED emitting light at, for example, 455 nm, is combined with a single phosphor, $Y_3Al_5O_{12}:Ce^{3+}$. The device illustrated in FIG. 9 operates at a luminous equivalent of 299 and has a color gamut that is 62% of the area of the color gamut of the NTSC standard.

Figure 10:
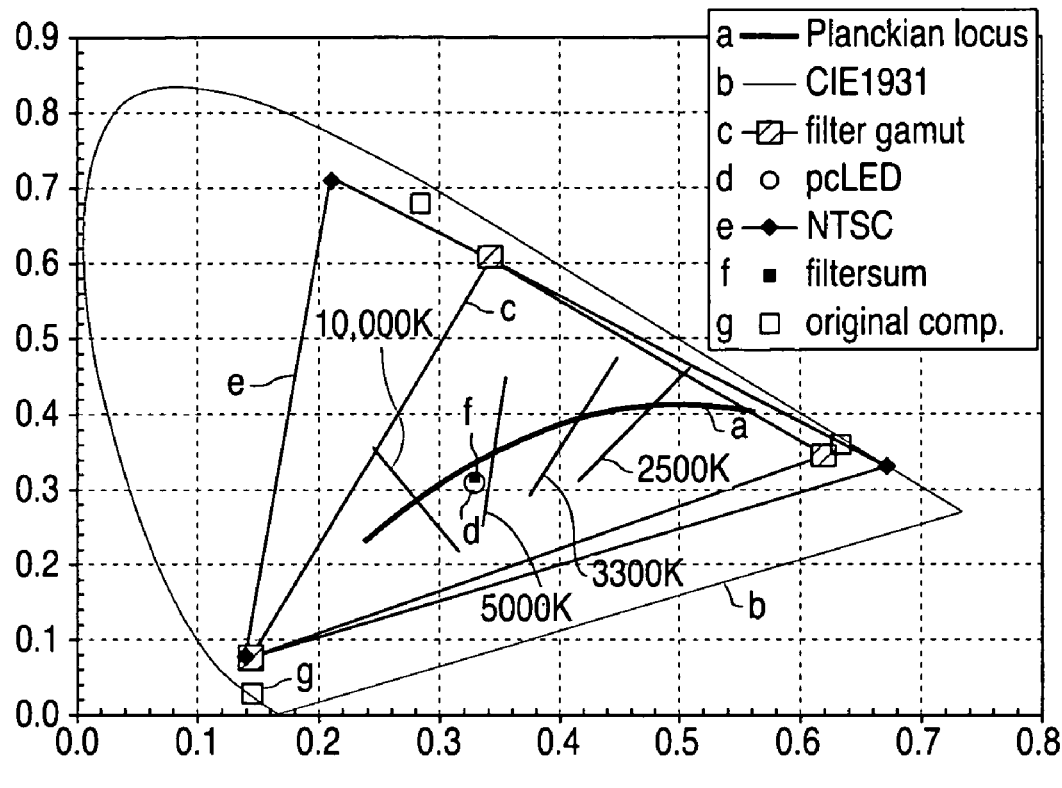
Figure 10:
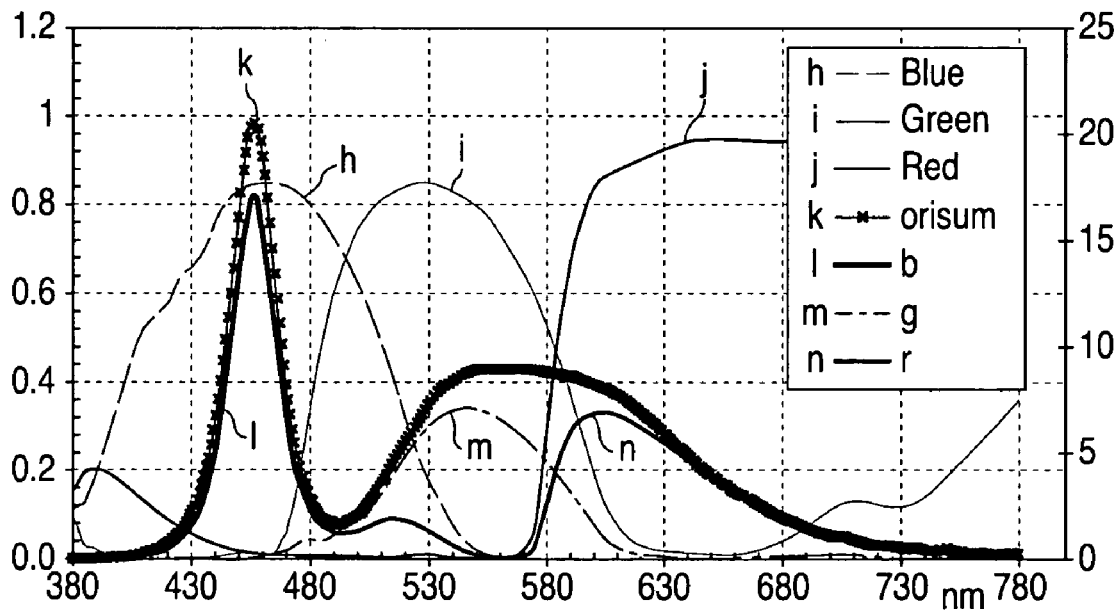

In the device illustrated in FIG. 10, a red-emitting phosphor, $SrS:Eu^{2+}$, is added to the device of FIG. 9. The addition of $SrS:Eu^{2+}$ does not significantly impact the performance of the device. The device illustrated in FIG. 10 operates at a luminous equivalent of 291 and has a color gamut that is 62% of the area of the color gamut of the NTSC standard.

Figure 11:
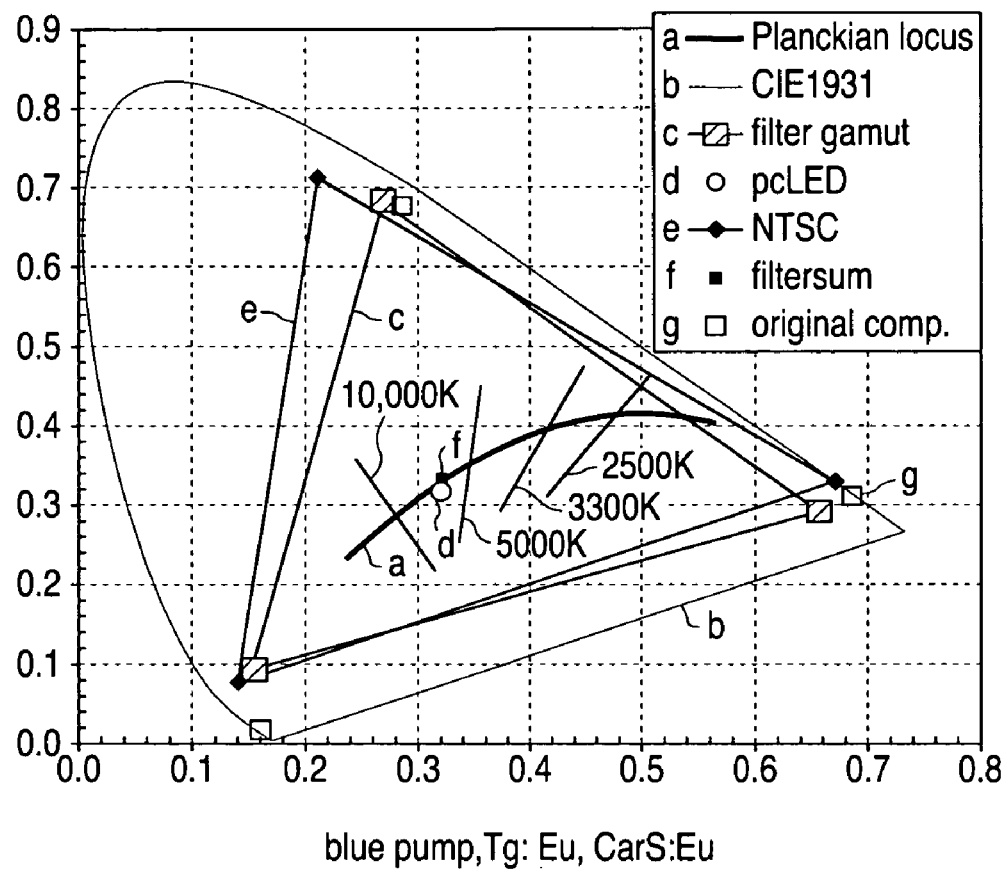
Figure 11:
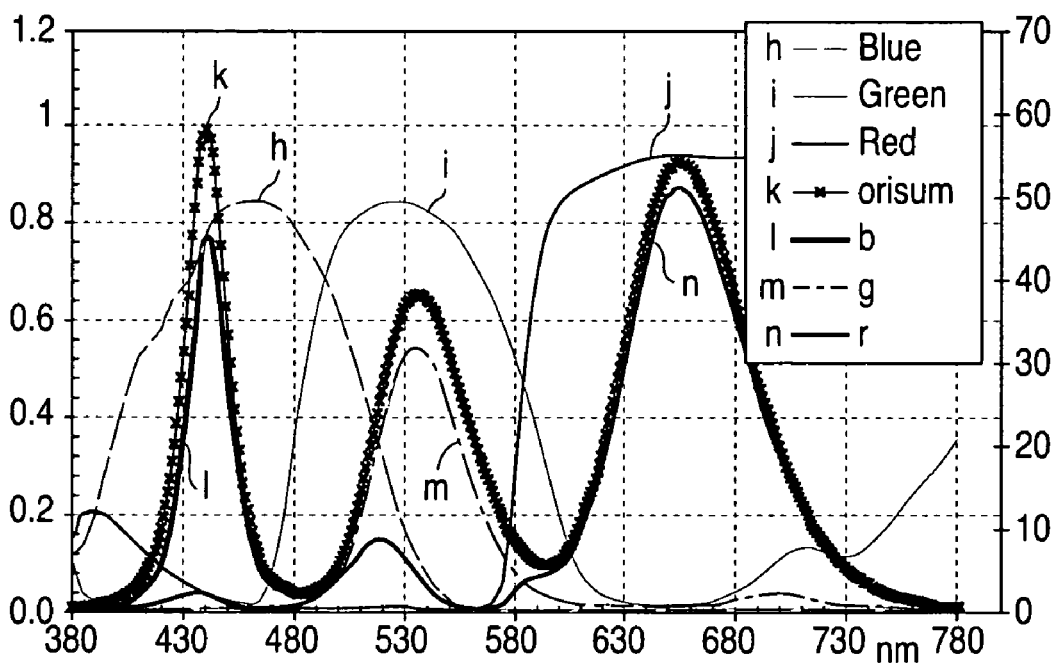

The device illustrated in FIG. 11 combines a blue light emitting diode with $SrGa_2S_4:Eu^{2+}$ and $CaS:Eu^{2+}$. This device demonstrates an excellent color gamut (86% of NTSC) but a poor luminous equivalent of 200. In this case, it is preferable to form discrete phosphor regions as illustrated in FIGS. 3-6, rather than mix the phosphors as illustrated in FIG. 1.

Figure 12:
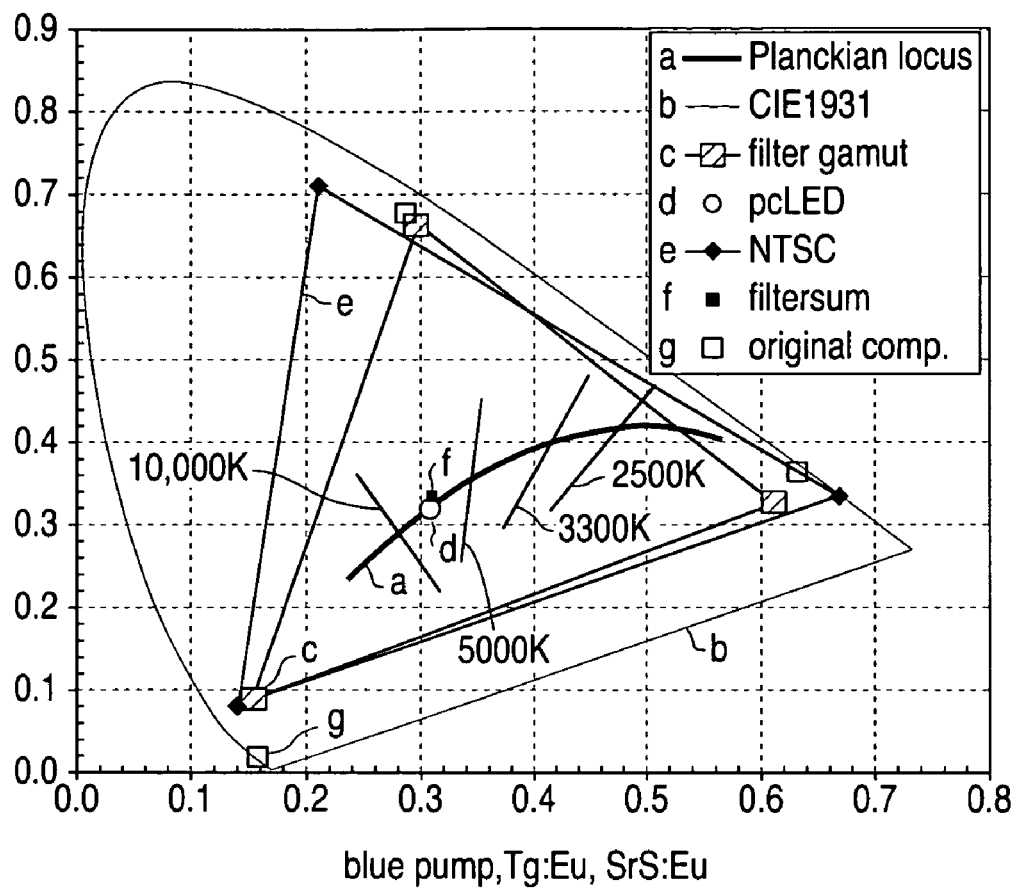
Figure 12:
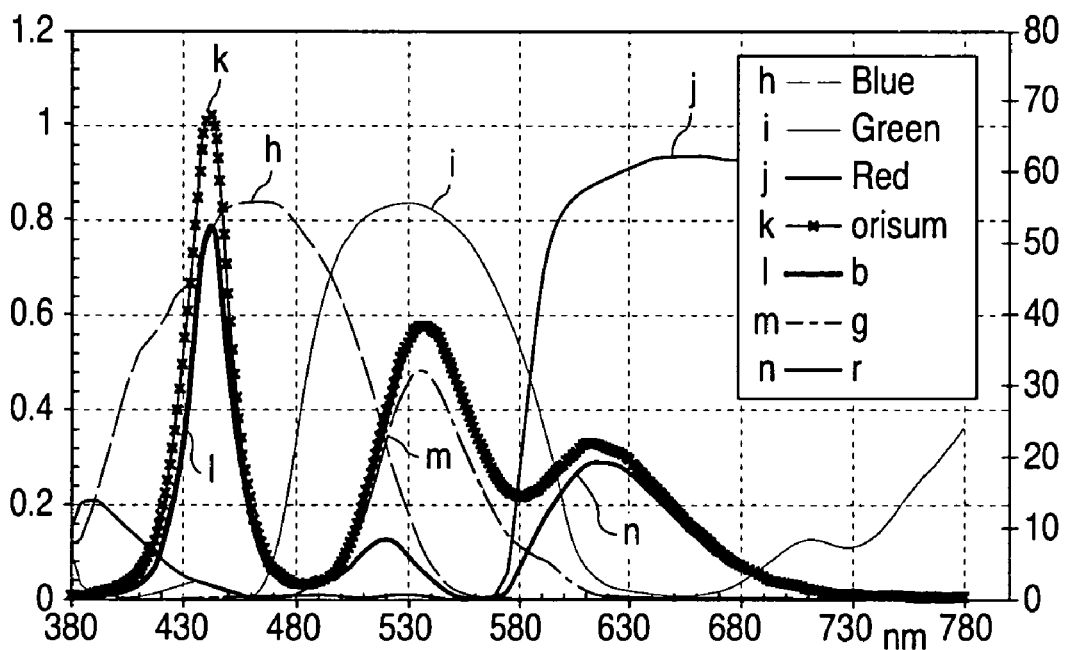

In the device illustrated in FIG. 12, the $CaS:Eu^{2+}$ of the device of FIG. 11 is replaced by $SrS:Eu^{2+}$. This device demonstrates both excellent color gamut (73% of NTSC) and excellent luminous equivalent (298). In this case, it is preferable to form discrete phosphor regions as illustrated in FIGS. 3-6, rather than mix the phosphors as illustrated in FIG. 1.

Figure 13:
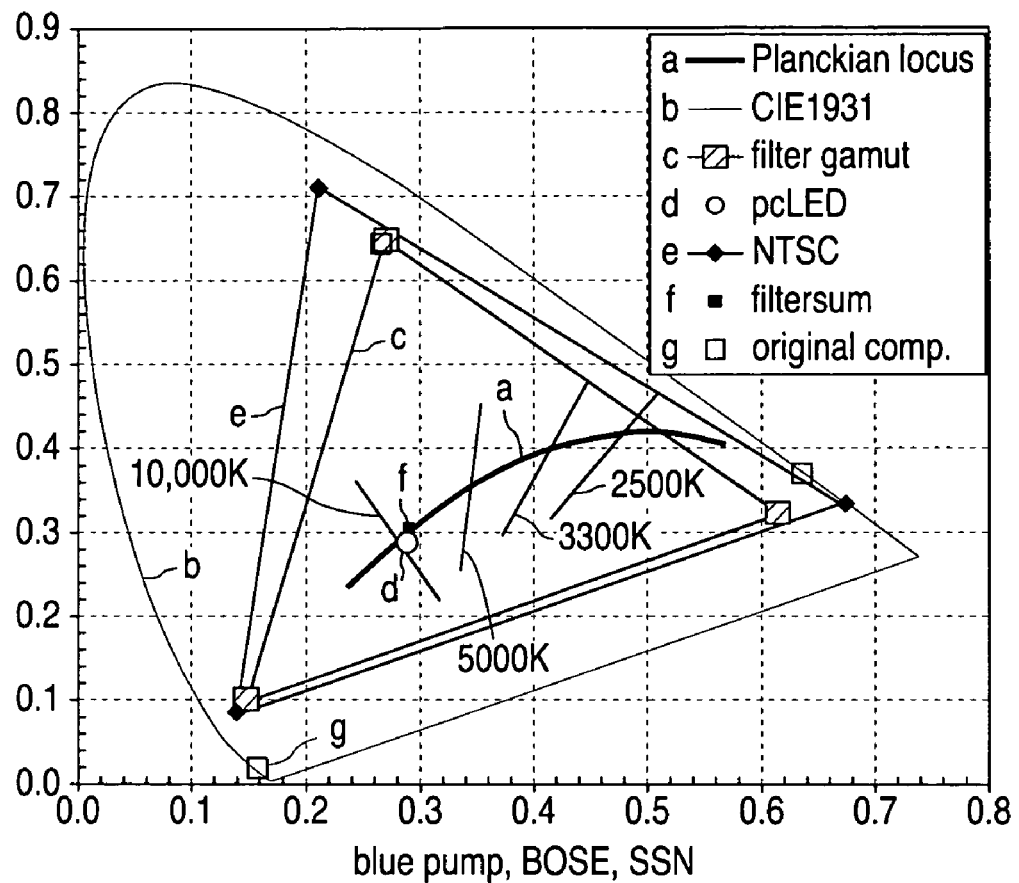
Figure 13:
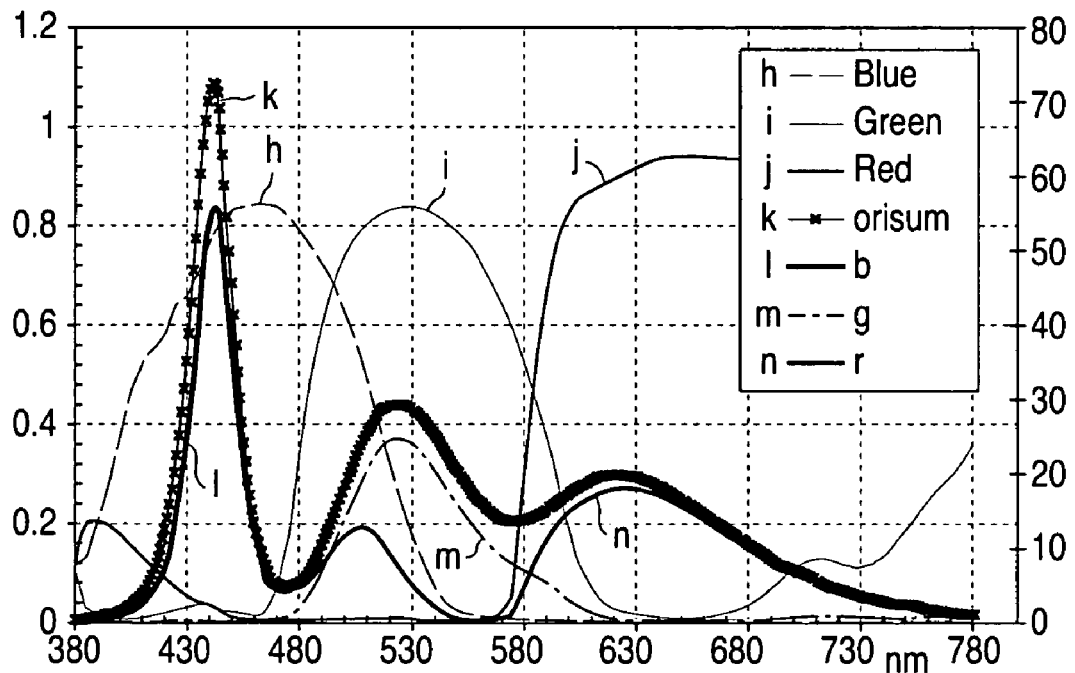

The device illustrated in FIG. 13 combines a blue light emitting diode with $Sr_{1-x}Ba_xSiO_4:Eu^{2+}$ and $Sr_2Si_5N_8:Eu^{2+}$. The device has 72% the color gamut of NTSC and a luminous equivalent of 241.

In a third application, an illumination device includes phosphors spaced apart from one or more LEDs. An example of such a device is the device illustrated in FIG. 8 minus LCD 14. In such embodiments, the phosphor arrangement is selected to maximize luminous equivalent and color rendering index. Phosphor combinations such as those described above in the first application may be appropriate.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A system comprising:
    a semiconductor light emitting device capable of emitting first light having a first peak wavelength;
    a first fluorescent material layer comprising a first wavelength converting material capable of absorbing the first light and emitting second light having a second peak wavelength longer than the first peak wavelength; and
    a second fluorescent material layer comprising a second wavelength converting material capable of emitting third light having a third peak wavelength longer than the second peak wavelength, wherein the second fluorescent material layer is disposed adjacent to the semiconductor light emitting device;
    wherein at least one of the first fluorescent material layer and the second fluorescent material layer comprise a second material that is not a wavelength converting material; and
    wherein the second fluorescent material layer is substantially free of the first wavelength converting material.

2. The system of claim 1 wherein the second fluorescent material layer overlies the semiconductor light emitting device and the first fluorescent material layer overlies the second fluorescent material layer.

3. The system of claim 1 wherein:
    the first fluorescent material layer is disposed on a first portion of the semiconductor light emitting device;
    the second fluorescent material layer is disposed on a second portion of the semiconductor light emitting device; and
    the first portion is adjacent to the second portion.

4. The system of claim 1 wherein:
    the first fluorescent material layer is disposed on a first plurality of discrete regions on the semiconductor light emitting device; and
    the second fluorescent material layer is disposed on a second plurality of discrete regions on the semiconductor light emitting device.

5. The system of claim 4 wherein the first plurality of discrete regions and the second plurality of discrete regions form a checkerboard pattern.

6. The system of claim 1 wherein:
    the second fluorescent material layer is disposed on a plurality of discrete regions on the semiconductor light emitting device; and
    the first fluorescent material layer overlies the second fluorescent material layer.

7. The system of claim 1 wherein:
    the first peak wavelength is blue;
    the second peak wavelength is green; and
    the third peak wavelength is red.

8. The system of claim 1 wherein:
    the first peak wavelength is blue;
    the second peak wavelength is yellow; and
    the third peak wavelength is red.

9. The system of claim 1 wherein the first wavelength converting material is phosphor selected from the group of $(Lu_{1-x-y-a-b}Y_xGd_y)_3(Al_{1-z}Ga_z)_5O_{12}:Ce_a^{3+}Pr_b^{3+}$ to wherein $0<x<1$, $0<y<1$, $0<z\leq0.1$, $0<a\leq0.2$ and $0<b\leq0.1$, $Lu_3Al_5O_{12}:Ce^{3+}$, $Y_3Al_5O_{12}:Ce^{3+}$, $(Sr_{1-a-b}Ca_bBa_c)Si_xN_yO_z:Eu_a^{2+}$ wherein $a=0.002-0.2$, $b=0.0-0.25$, $c=0.0-0.25$, $x=1.5-2.5$, $y=1.5-2.5$, $z=1.5-2.5$, $SrSi_2N_2O_2:Eu^{2+}$, $(Sr_{1-u-v-x}Mg_uCa_vBa_x)(Ga_{2-y-z}Al_yIn_zS_4):Eu^{2+}$, $SrGa_2S_4: Eu^{2+}$, and $Sr_{1-x}Ba_xSiO_4:Eu^{2+}$.

10. The system of claim 1 wherein the second wavelength converting material is a phosphor selected from the group of $(Ca_{1-x}Sr_x)S:Eu^{2+}$ wherein $0<x\leq1$, $CaS:Eu^{2-}$, $SrS:Eu^{2+}$, $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$, and $Sr_2Si_5N_8: Eu^{2-}$.

11. The system of claim 1 wherein the second material is selected from the group of resin, silicone, and silica.

12. The system of claim 1 wherein the first fluorescent material layer and second fluorescent material layer are arranged to maximize a luminous equivalent of a combination of the first, second, and third light.

13. The system of claim 1 wherein the first fluorescent material layer and second fluorescent material layer are arranged to maximize color rendering index of a combination of the first, second, and third light.

14. The system of claim 1 further comprising a third fluorescent material layer comprising a third wavelength converting material capable of emitting fourth light having a fourth peak wavelength.

15. The system of claim 14 wherein:
    the first peak wavelength is UV;
    the second peak wavelength is blue;
    the third peak wavelength is red; and
    the fourth peak wavelength is green.

16. The system of claim 15 wherein:
    the second fluorescent material layer is adjacent to the semiconductor light emitting device;
    the third fluorescent material layer overlies the second fluorescent material layer; and
    the first fluorescent material layer overlies the third fluorescent material layer.

17. The system of claim 1 wherein the first fluorescent material layer comprises an amount of second wavelength converting material.

18. A device comprising:
    at least one semiconductor light emitting device capable of emitting first light having a first peak wavelength;
    a first fluorescent material layer comprising a first wavelength converting material, the first wavelength converting material capable of absorbing the first light and emitting second light having a second peak wavelength, the second peak wavelength being longer than the first peak wavelength; and
    a second fluorescent material layer comprising a second wavelength converting material, the second wavelength converting material capable of emitting third light having a third peak wavelength longer than the second peak wavelength;
    wherein the first fluorescent material layer and the second fluorescent material layer are disposed in a path of light emitted by the light emitting device and are spaced apart from the light emitting device.

19. The device of claim 18 wherein the third light combines with the first light and the second light to form mixed light that appears white.

20. The device of claim 18 wherein the first fluorescent material layer and second fluorescent material layer are arranged to maximize a luminous equivalent of a combination of the first, second, and third light.

21. The device of claim 18 further comprising one or more filters.

22. The device of claim 21 wherein the first fluorescent material layer and second fluorescent material layer are arranged to maximize a gamut of color after the first, second, and third light are filtered by the one or more filters.

23. The device of claim 18 wherein the first wavelength converting material and second wavelength converting material are formed as discrete layers.

24. The device of claim 23 wherein the second fluorescent material layer is closer to the at least one semiconductor light emitting device than the first fluorescent material layer.

25. The device of claim 18 wherein the first wavelength converting material is selected from the group of $(Lu_{1-x-y-a-b}Y_xGd_y)_3(Al_{1-z}Ga_z)_5O_{12}:Ce_a^{3+}Pr_b^{3+}$ wherein $0<x<1$, $0<y<1$, $0<z\leq0.1$, $0<a\leq0.2$ and $0<b\leq0.1$, $Lu_3Al_5O_{12}:Ce$, $Y_3Al_5O_{12}:Ce^{3+}$, $(Sr_{1-a-b}Ca_bBa_c)Si_xN_yO_z:Eu_a^{2+}$ wherein $a=0.002-0.2$, $b=0.0-0.25$, $c=0.0-0.25$, $x=1.5-2.5$, $y=1.5-2.5$, $z=1.5-2.5$, $SrSi_2N_2O_2:Eu^{2+}$, $(Sr_{1-u-v-x}Mg_uCa_vBa_x)(Ga_{2-y-z}Al_yIn_zS_4):Eu^{2+}$, $SrGa_2S_4:Eu^{2+}$, and $Sr_{1-x}Ba_xSiO_4:Eu^{2+}$.

26. The device of claim 18 wherein the second wavelength converting material is selected from the group of $(Ca_{1-x}Sr_x)S:Eu^{2+}$ wherein $0<x\leq1$, $CaS:Eu^{2+}$, $SrS:Eu^{2+}$, $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$, and $Sr_2Si_5N_8:Eu^{2+}$.

27. The device of claim 18 further comprising an LCD.

28. The device of claim 18 further comprising a cover plate spaced apart from the at least one semiconductor light emitting device.

29. The device of claim 28 wherein the first fluorescent material layer and the second fluorescent material layer are disposed on the cover plate.

30. The device of claim 18 wherein the second fluorescent material layer is substantially free of the first wavelength converting material.

31. The device of claim 18 further comprising a sidewall disposed adjacent to at least one of the first and second fluorescent material layers.

32. The device of claim 31 wherein the sidewall is reflective.

33. The device of claim 31 wherein the sidewall is substantially perpendicular to a plane on which the light emitting device is disposed.

* * * * *

UNITED STATES PATENT AND TRADEMARK OFFICE
CERTIFICATE OF CORRECTION

| | | |
|---|---|---|
| PATENT NO. | : 7,250,715 B2 | Page 1 of 1 |
| APPLICATION NO. | : 10/785616 | |
| DATED | : July 31, 2007 | |
| INVENTOR(S) | : Gerd O. Mueller and Regina Mueller-Mach | |

It is certified that error appears in the above-identified patent and that said Letters Patent is hereby corrected as shown below:

Column 10, line 7, claim 9: Cancel "to wherein" and substitute --wherein--.

Column 10, line 12, claim 9: Cancel "$Mg_u$-" and substitute --$Mg_u$--.

Column 10, line 16, claim 10: Cancel "$Eu^2$–" and substitute --$Eu^{2+}$--.

Column 10, line 18, claim 10: Cancel "$Eu^{2-}$," and substitute --$Eu^{2+}$.--.

Column 12, line 3, claim 26: Cancel: "of(" and substitute --of (--.

Signed and Sealed this

Twenty-eighth Day of October, 2008

JON W. DUDAS
*Director of the United States Patent and Trademark Office*